US008093165B2

United States Patent
Koike et al.

(10) Patent No.: US 8,093,165 B2
(45) Date of Patent: Jan. 10, 2012

(54) TIO$_2$-CONTAINING SILICA GLASS AND OPTICAL MEMBER FOR EUV LITHOGRAPHY USING THE SAME

(75) Inventors: Akio Koike, Tokyo (JP); Yasutomi Iwahashi, Tokyo (JP); Shinya Kikugawa, Tokyo (JP); Yuko Tachibana, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/869,035

(22) Filed: Aug. 26, 2010

(65) Prior Publication Data

US 2010/0323872 A1   Dec. 23, 2010

Related U.S. Application Data

(63) Continuation of application No. PCT/JP2009/054225, filed on Feb. 27, 2009.

(30) Foreign Application Priority Data

Feb. 27, 2008  (JP) .................................. 2008-046267

(51) Int. Cl.
*C03C 3/06* (2006.01)
*C03B 19/06* (2006.01)
*C03B 37/018* (2006.01)
*C03B 25/00* (2006.01)

(52) U.S. Cl. .............................. 501/54; 65/17.4; 65/391
(58) Field of Classification Search ..................... 501/53, 501/54; 65/17.3, 17.4, 117, 391
See application file for complete search history.

(56) References Cited

U.S. PATENT DOCUMENTS

| | | | |
|---|---|---|---|
| 7,294,595 | B2 | 11/2007 | Iwahashi et al. |
| 7,410,922 | B2 | 8/2008 | Iwahashi et al. |
| 7,419,924 | B2 | 9/2008 | Koike et al. |
| 7,429,546 | B2 | 9/2008 | Iwahashi et al. |
| 7,462,574 | B2 | 12/2008 | Iwahashi et al. |
| 7,485,593 | B2 | 2/2009 | Ezaki et al. |
| 7,538,052 | B2 | 5/2009 | Iwahashi et al. |
| 2002/0157421 | A1 | 10/2002 | Ackerman et al. |

(Continued)

FOREIGN PATENT DOCUMENTS

EP   1 795 506   6/2007

OTHER PUBLICATIONS

S. Graham et al. Proceedings of SPIE, vol. 5037, pp. 460-469 (2003).
H. Oizumi et al., Japanese Journal of Applied Physics, vol. 46, No. 25, pp. L633-L635 (2007).
U.S. Appl. No. 12/862,174, filed Aug. 24, 2010, Koike et al.

(Continued)

*Primary Examiner* — Jerry A Lorengo
*Assistant Examiner* — Noah Wiese
(74) *Attorney, Agent, or Firm* — Oblon, Spivak, McClelland, Maier & Neustadt, L.L.P.

(57) ABSTRACT

The present invention provides a TiO$_2$—SiO$_2$ glass in which when used as an optical member for an exposure tool for EUVL, a thermal expansion coefficient is substantially zero at the time of irradiation with high-EUV energy light, and physical properties of a multilayer can be kept over a long period of time by releasing hydrogen from the glass. The present invention relates to a TiO$_2$-containing silica glass having a fictive temperature of 1,100° C. or lower, a hydrogen molecule concentration of 1×10$^{16}$ molecules/cm$^3$ or more, and a temperature, at which a linear thermal expansion coefficient is 0 ppb/° C., falling within the range of from 40 to 110° C.

20 Claims, 4 Drawing Sheets

U.S. PATENT DOCUMENTS

| | | | |
|---|---|---|---|
| 2005/0215413 A1* | 9/2005 | Alkemper et al. | 501/54 |
| 2005/0272590 A1* | 12/2005 | Iwahashi et al. | 501/55 |
| 2006/0179879 A1* | 8/2006 | Ellison et al. | 65/17.4 |
| 2007/0134566 A1* | 6/2007 | Maida et al. | 430/5 |
| 2007/0207911 A1 | 9/2007 | Koike et al. | |
| 2009/0122281 A1 | 5/2009 | Iwahashi et al. | |
| 2010/0261597 A1 | 10/2010 | Koike et al. | |

OTHER PUBLICATIONS

U.S. Appl. No. 12/870,156, filed Aug. 27, 2010, Koike et al.
U.S. Appl. No. 12/868,900, filed Aug. 26, 2010, Koike et al.
Amendments submitted Oct. 28, 2010, in corresponding European Application No. 09714364.8, filed Feb. 27, 2009.

* cited by examiner

TIO$_2$-CONTAINING SILICA GLASS AND OPTICAL MEMBER FOR EUV LITHOGRAPHY USING THE SAME

TECHNICAL FIELD

The present invention relates a TiO$_2$-containing silica glass (hereinafter referred to as "TiO$_2$—SiO$_2$ glass" in this specification), and in particular, to a TiO$_2$—SiO$_2$ glass to be used as an optical member for an exposure tool for EUV lithography. The EUV (extreme ultraviolet) light as referred to in the invention refers to light having a wavelength in a soft X-ray region or a vacuum ultraviolet region, specifically light having a wavelength of from about 0.2 to 100 nm.

BACKGROUND ART

In the photo lithography technology, an exposure tool for manufacturing an integrated circuit by transferring a fine circuit pattern onto a wafer has hitherto been widely utilized. With the trend toward a higher degree of integration and a higher function of an integrated circuit, the refinement of the integrated circuit is advancing. The exposure tool is hence required to form a circuit pattern image with high resolution on a wafer surface at a long focal depth, and shortening of the wavelength of an exposure light source is being advanced. The exposure light source is further advancing from conventional g-line (wavelength: 436 nm), i-line (wavelength: 365 nm) and a KrF excimer laser (wavelength: 248 nm), and an ArF excimer layer (wavelength: 193 nm) is coming to be employed. Also, in order to cope with a next-generation integrated circuit whose circuit line width will become not more than 70 nm, an immersion lithography technique and a double exposure technique, each using an ArF excimer laser, are regarded as being leading. However, it is considered that even these techniques would be able to cover only the generation with a line width of up to 45 nm.

Under the foregoing technical trends, a lithography technique using, as an exposure light source, light having a wavelength of 13 nm to represent EUV light (extreme ultraviolet light) is considered to be applicable over generation of 32 nm and thereafter, and is attracting attention. The principle of image formation of the EUV lithography (hereinafter referred to as "EUVL") is identical with that of the conventional lithography from the viewpoint that a mask pattern is transferred using a projection optical system. However, since there is no material capable of transmitting light therethrough in the EUV light energy region, a refractive optical system cannot be used. Accordingly, the optical systems are all reflecting optical systems.

The optical member for an exposure tool for EUVL includes a photomask and a mirror and is basically configured with (1) a substrate, (2) a reflective multilayer formed on the substrate and (3) an absorber layer formed on the reflective multilayer. For the reflective multilayer, an Mo/Si reflective multilayer in which an Mo layer and an Si layer are alternately laminated is investigated; and for the absorber layer, as a film forming material, Ta and Cr are investigated. For the substrate, a material having a low thermal expansion coefficient is required so as not to generate a strain even under irradiation with EUV light, and a glass having a low thermal expansion coefficient or the like is investigated.

The TiO$_2$—SiO$_2$ glass is known as an extremely low thermal expansion material having a thermal expansion coefficient (CTE) lower than that of a silica glass. Also, since the thermal expansion coefficient can be controlled by the TiO$_2$ content in glass, a zero-expansion glass whose thermal expansion coefficient is close to 0 can be obtained. Accordingly, the TiO$_2$—SiO$_2$ glass involves a possibility as a material to be used in an optical member for an exposure tool for EUVL.

According to the conventional preparation method of a TiO$_2$—SiO$_2$ glass, first of all, a silica precursor and a titania precursor are each converted into a gas phase and then mixed with each other. The mixture in a gas phase is introduced into a burner and thermally decomposed, thereby forming a TiO$_2$—SiO$_2$ glass particle. This TiO$_2$—SiO$_2$ glass particle is deposited in a refractory container and melted therein simultaneously with the deposition, thereby forming a TiO$_2$—SiO$_2$ glass.

Patent Document 1 discloses a method in which a TiO$_2$—SiO$_2$ porous glass body is formed and converted it into a glass body, and a mask substrate is then obtained.

The mirror to be installed in an exposure tool for EUVL must withstand the irradiation with EUV over a long period of time as 30,000 hours and involves a problem of a change in properties of the multilayer with a lapse of time. Main causes of the change with a lapse of time are contamination of carbon and oxidation of the multilayer due to an extremely small amount of water. A technique of using hydrogen is reported for the purpose of cleaning the contamination of carbon or reducing the oxidized multilayer (see, for example, Non-Patent Documents 1 and 2).

Patent Document 1: US-A-2002/157421
Non-Patent Document 1: S. Graham, C. Steinhaus, M. Clift, L. Klebanoff, and S. Bajt, *Proceedings of SPIE*, Vol. 5037, pp. 460-469 (2003)
Non-Patent Document 2: H. Oizumi, A. Izumi, K. Motai, I. Nishiyama, and A. Namiki, *Japanese Journal of Applied Physics*, Vol. 46, No. 22, pp.L633-L635 (2007)

DISCLOSURE OF THE INVENTION

In order to enhance throughput of the exposure tool for EUVL, it is effective to increase the EUV light energy to be used for the exposure. Therefore, in that case, there is a possibility that the temperature of the member rises exceeding an estimated temperature. Specifically, since there is a possibility that the temperature rises to 40 to 110° C., it is preferred that the expansion is substantially zero at such a temperature. This is because in the case of a photomask, etc., a change in pitch of a pattern is prevented from occurring, and in the case of a stepper mirror, etc., a change in shape is prevented from occurring.

Also, when a dimensional change is large during a temperature rise of from room temperature to a temperature at the time of use in the exposure tool for EUVL, since the pitch or shape of the foregoing pattern changes from the state at the time of room temperature, a possibility that an optical design of the optical member becomes complicated may be considered. Accordingly, it is preferred that an average linear thermal expansion coefficient at from room temperature to a temperature such as 40 to 110° C. is small in an optical member for an exposure tool using high EUV energy light aiming at throughput enhancement.

However, in the foregoing patent document, although the temperature range, in which the linear thermal expansion coefficient is substantially zero, is wide, a temperature, at which the expansion is zero, is room temperature. Thus, there is a possibility that the linear thermal expansion coefficient is not zero at a temperature as 40 to 110° C., and the change in dimension or the change in shape cannot be neglected. Also, since the average linear thermal expansion coefficient at from room temperature to a temperature as 40 to 110° C. is large, a problem that an optical design of the optical member becomes complicated may be considered.

Also, in the foregoing non-patent documents, a hydrogen atmosphere must be used, and a problem that the operation is not simple and easy is involved.

Also, by using heat due to high EUV energy light, when hydrogen exists in the atmosphere, an effect for cleaning the contamination of carbon and an effect for reducing the oxidized multilayer as described above can be expected. Also, when hydrogen exists in the atmosphere, suppression of the oxidation itself of the multilayer can be expected. In the case where a hydrogen molecule is contained in a glass, since the hydrogen molecule is extremely large in diffusion coefficient as compared with other components, the hydrogen is released from the inside of the glass. In particular, as the temperature of the glass increases, the release of the hydrogen molecule is caused more easily.

In order to solve the foregoing problems of the conventional technologies, an object of the invention is to provide a $TiO_2$—$SiO_2$ glass having thermal expansion properties suitable as an optical member for an exposure tool using high EUV energy light aiming at throughput enhancement and capable of keeping physical properties of a multilayer over a long period of time by releasing hydrogen from a glass.

The present invention provides a $TiO_2$-containing silica glass having a fictive temperature of 1,100° C. or lower, a hydrogen molecule concentration of $1 \times 10^{16}$ molecules/cm$^3$ or more, and a temperature, at which a linear thermal expansion coefficient (CTE) is 0 ppb/° C. (cross-over temperature; COT), falling within the range of from 40 to 110° C. (hereinafter referred to as "$TiO_2$—$SiO_2$ glass of the invention").

In the $TiO_2$—$SiO_2$ glass of the invention, it is preferred that a $TiO_2$ content is from 7.5 to 12% by mass.

Also, it is preferred that an average linear thermal expansion coefficient at from 20 to 100° C. is 60 ppb/° C. or lower.

Furthermore, it is preferred that a temperature width ΔT, in which a linear thermal expansion coefficient (CTE) is 0±5 ppb/° C., is 5° C. or greater. Moreover, it is preferred that the $TiO_2$—$SiO_2$ glass of the invention is free from an inclusion.

Also, the $TiO_2$—$SiO_2$ glass of the invention can be used as an optical member for EUV lithography.

Since in the $TiO_2$—$SiO_2$ glass of the invention, an average linear thermal expansion coefficient from room temperature relative to temperature rise at the time of irradiation with high EUV energy light is very small, and a linear thermal expansion coefficient at the time of irradiation with high EUV energy light is substantially zero, it is extremely suitable as an optical member for an exposure tool for EUVL. Also, it is possible to keep physical properties of the multilayer over a long period of time by releasing hydrogen from the glass.

BEST MODES FOR CARRYING OUT THE INVENTION

The $TiO_2$—$SiO_2$ glass of the invention is hereunder described.

In the $TiO_2$—$SiO_2$ glass of the invention, a hydrogen molecule concentration is $1 \times 10^{16}$ molecules/cm$^3$ or more. When the hydrogen molecule concentration is less than $1 \times 10^{16}$ molecules/cm$^3$, an effect for cleaning the contamination of carbon and an effect for reducing the oxidized multilayer cannot be expected. The hydrogen molecule concentration is more preferably $5 \times 10^{16}$ molecules/cm$^3$ or more, further preferably $1 \times 10^{17}$ molecules/cm$^3$ or more, and especially preferably $5 \times 10^{17}$ molecules/cm$^3$ or more. In order to endure the foregoing effects over a longer period of time, it is preferred that the hydrogen molecule concentration is $1 \times 10^{18}$ molecules/cm$^3$ or more.

The measurement of the hydrogen molecule concentration was carried out using a thermal desorption spectrometer (TDS), manufactured by ESCO Ltd. on the basis of Japanese Patent No. 3298974.

Figure 2:
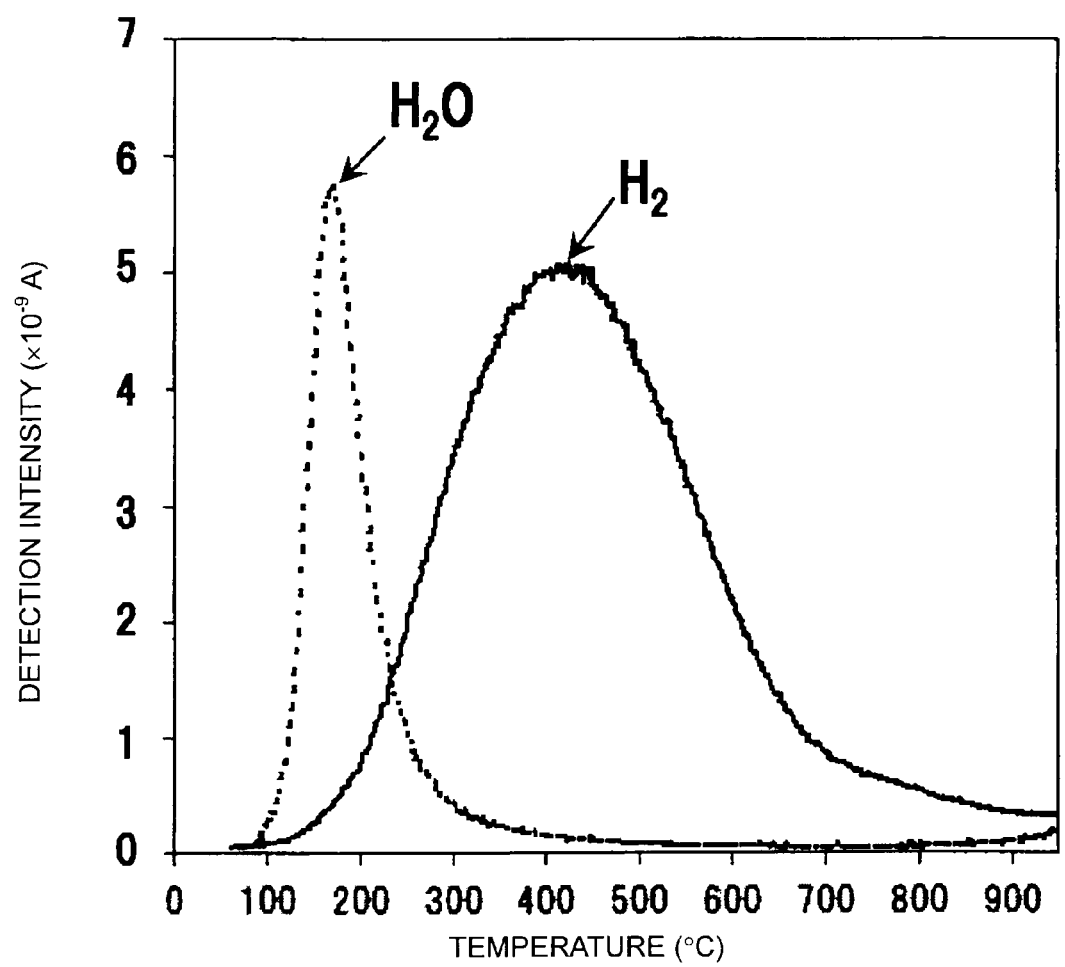
FIG. 2 is a thermal desorption profile of each of hydrogen molecule of a glass sample having a hydrogen molecule introduced thereinto and water molecule.

A glass sample having a hydrogen molecule introduced thereinto was placed in a thermal desorption spectrometer; the inside of a measurement chamber was evacuated to $5 \times 10^{-7}$ Pa or lower; the glass sample was then heated; and the mass number of an emitted gas was measured by a mass spectrometer set up in the thermal desorption spectrometer. A thermal desorption profile of hydrogen molecule is shown in FIG. 2. A thermal desorption profile of water molecule is also shown in FIG. 2 by reference.

In the desorption profile of hydrogen molecule, a peak was observed in the vicinity of from 200 to 800° C., with the vicinity of 420° C. being the maximum. Also, in the desorption profile of water molecule, a peak observed in the vicinity of from 100 to 200° C., with the vicinity of 150° C. being the maximum, is considered to be caused due to desorption of water physically adsorbed on the glass surface.

Figure 3:
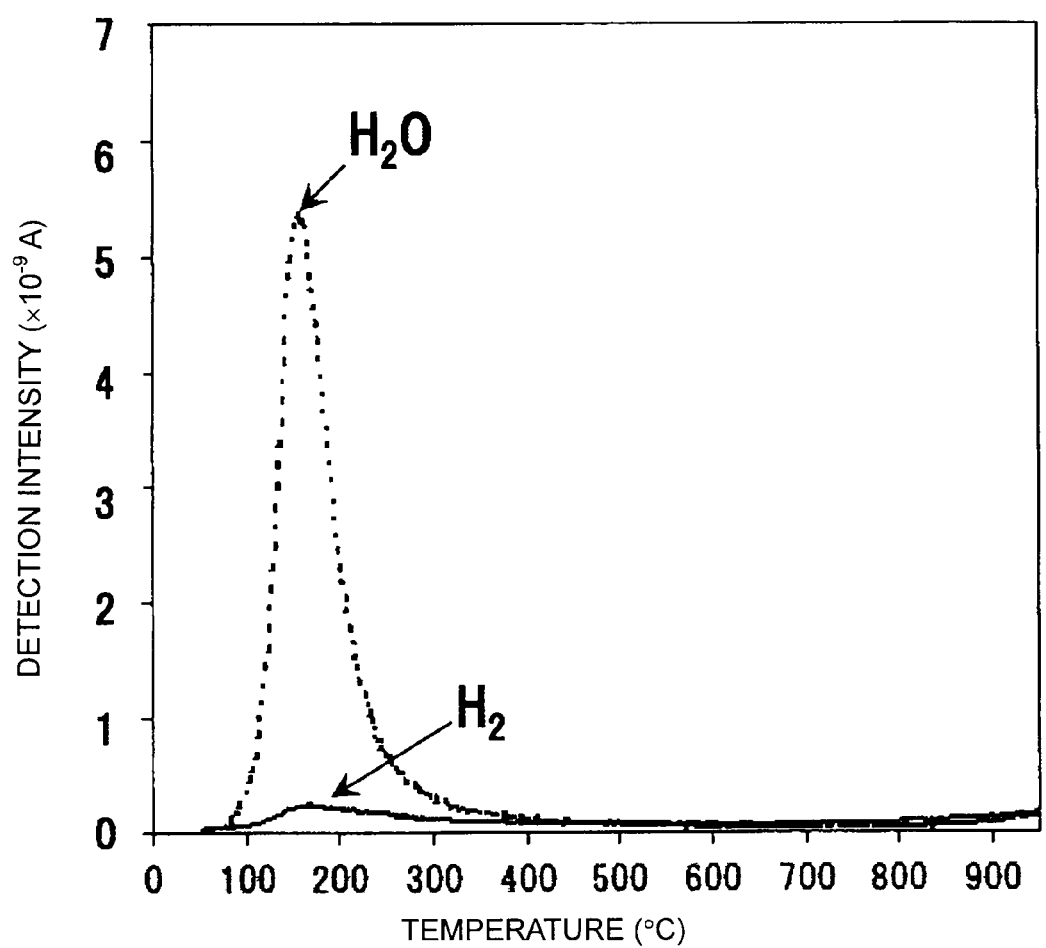
FIG. 3 is a thermal desorption profile of each of hydrogen molecule of a glass sample having no hydrogen molecule introduced thereinto and water molecule.

Subsequently, a glass sample having no hydrogen molecule introduced thereinto was similarly placed in a thermal desorption spectrometer; the inside of a measurement chamber was evacuated to $5 \times 10^{-7}$ Pa or lower; the glass sample was then heated; and the mass number of an emitted gas was measured. An observed thermal desorption profile of each of hydrogen molecule and water molecule is similarly shown in FIG. 3. In the desorption profile of water molecule, a peak which is considered to be caused due to desorption of physically adsorbed water was observed in the vicinity of from 100 to 200° C. similarly to that in FIG. 2. In contrast, in the desorption profile of hydrogen molecule, the peak as observed in FIG. 2, with the vicinity 420° C. being the maximum, was not observed.

According to this, in the desorption profile of hydrogen molecule in FIG. 2, the peak observed in the vicinity of from 200 to 800° C., with the vicinity of 420° C. being the maximum, can be considered to be caused due to desorption of the hydrogen molecule introduced into the glass.

Accordingly, the number of hydrogen molecules desorbed from a measurement sample can be calculated from an integrated intensity ratio in the foregoing desorption peak of hydrogen molecule between the measurement sample and a standard sample whose hydrogen concentration is already known.

For example, when silicon having a hydrogen ion injected thereinto is used as the standard sample, a measurement method is as follows.

Figure 4:
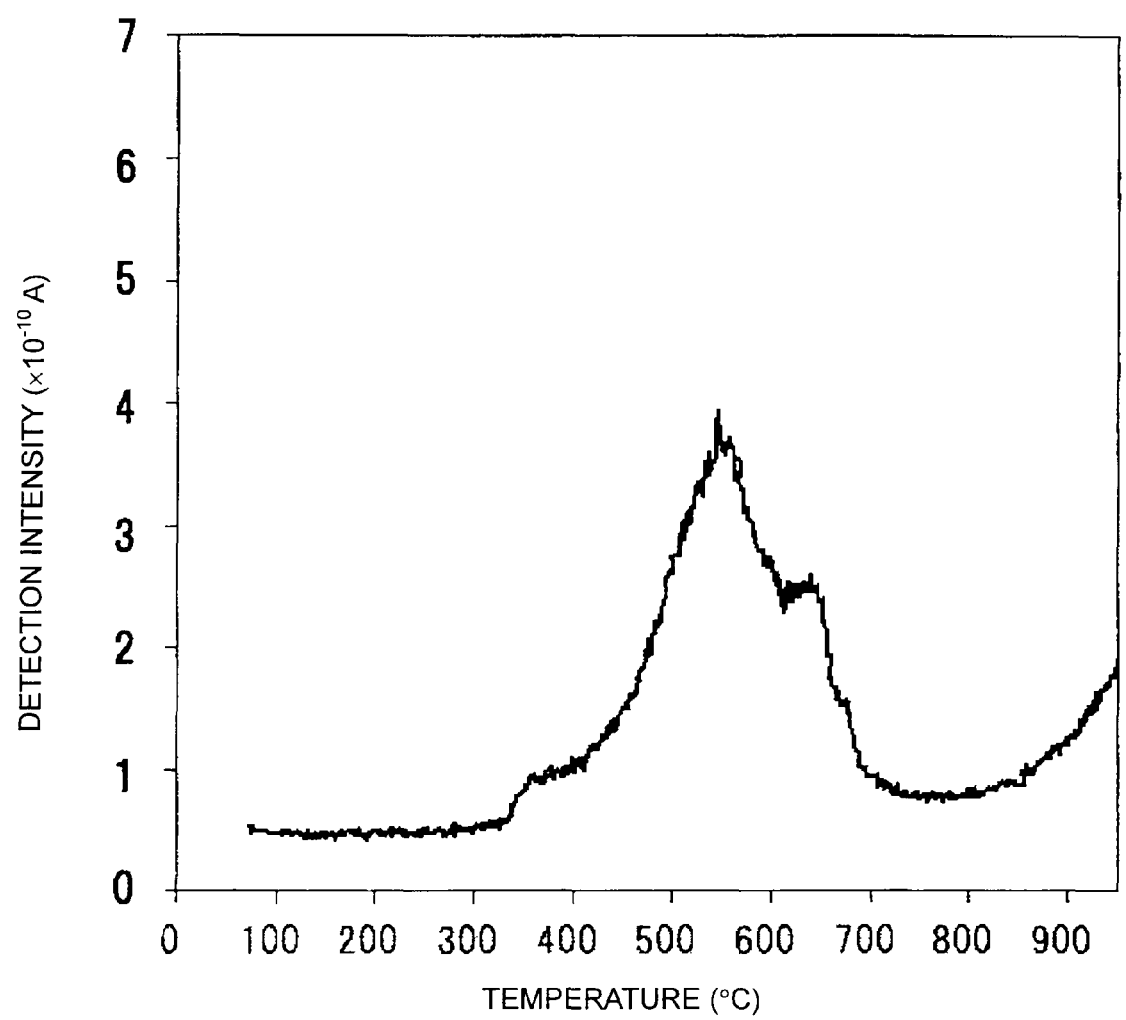
FIG. 4 is a thermal desorption profile of hydrogen molecule of silicon having a hydrogen ion injected thereinto.

A thermal desorption profile of hydrogen molecule observed by similarly placing a silicon reference sample having $1 \times 10^{16}$ hydrogen ions injected thereinto (manufactured by ESCO Ltd.) in a thermal desorption spectrometer; and evacuating the inside of a measurement chamber to $5 \times 10^{-7}$ Pa or lower, followed by heating is similarly shown in FIG. 4. A hydrogen molecule whose desorption peak is observed in the vicinity of from 350 to 750° C., with the vicinity of 550° C. being the maximum, is one generated by desorption of the $1 \times 10^{16}$ hydrogen ions in the silicon.

The number of desorbed hydrogen molecules in FIG. 2 was calculated to be $1.6 \times 10^{17}$ from an integrated intensity ratio of the desorption peak of hydrogen molecule in FIG. 2 and FIG. 4. Furthermore, the hydrogen molecule concentration introduced into the glass sample was calculated to be $1.6 \times 10^{18}$ molecules/cm$^3$ from a volume (0.1 cm$^3$) of the measured glass sample.

Figure 1:
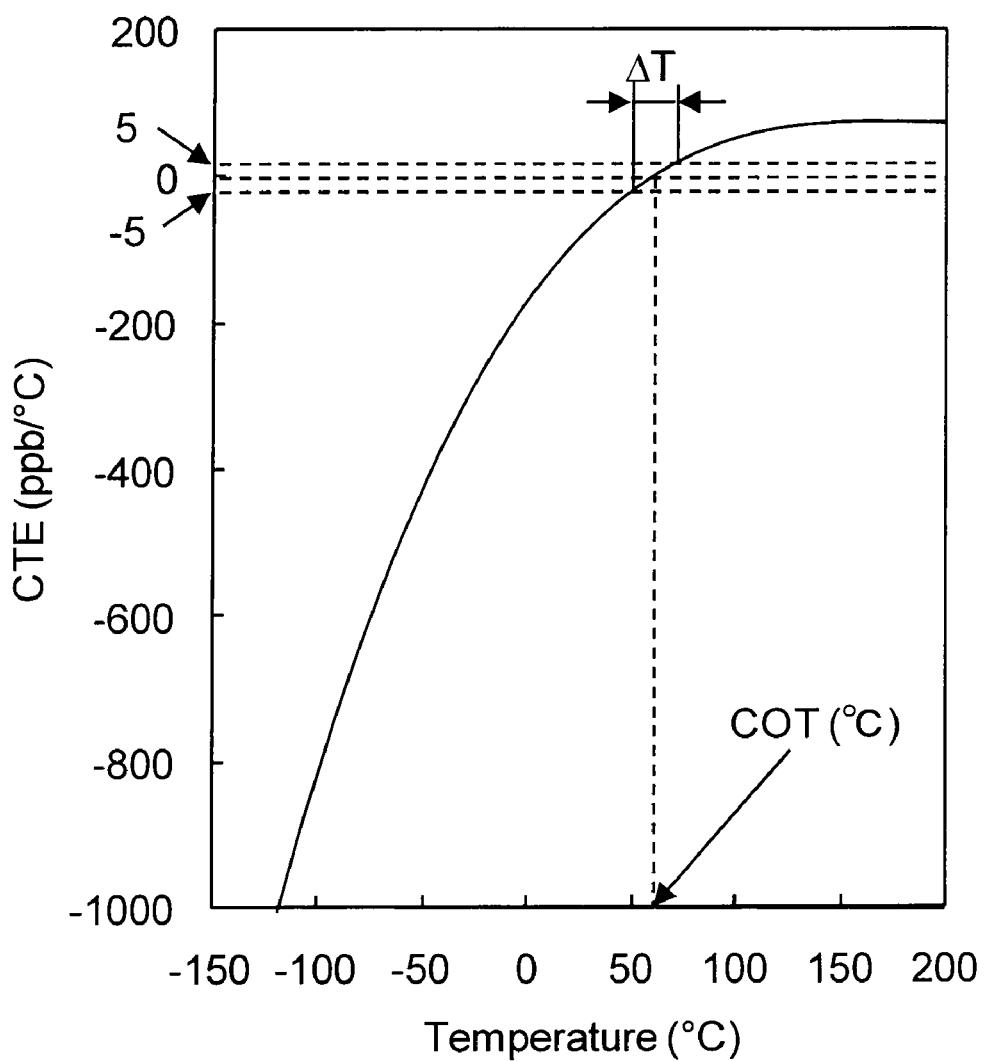
FIG. 1 is a graph of plotting the relationship between CTE and the temperature.

The COT, average linear thermal expansion coefficient at from 20 to 100° C., and $\Delta T$ of the $TiO_2$—$SiO_2$ glass can be determined by measuring the linear thermal expansion coefficient (CTE) of the $TiO_2$—$SiO_2$ glass by a known method, for example, by using a laser interferometric dilatometer in the temperature range of from −150 to +200° C. and plotting the relationship between CTE and the temperature as shown in FIG. 1.

In carrying out EUVL, for the purpose of preventing changes in dimension and shape due to a change in temperature of an optical member such as a mirror, it is desirable that the COT of the optical member placed in an exposure tool using high EUV energy light falls within the range of from 40 to 110° C. Furthermore, it is desirable that the range where the linear thermal expansion coefficient is 0±5 ppb/° C., i.e., the linear thermal expansion coefficient is substantially zero, is wide. Specifically, it is preferred that a temperature at which the linear thermal expansion coefficient is 0±5 ppb/° C. is 5° C. or greater. It has been suggested that the temperature of the optical member locally rises, especially in the case of a member close to a light source, because high-energy EUV light is irradiated. Though it depends on an irradiation condition of EUV light, it is estimated that the temperature of the optical member rises to 40 to 110° C., and furthermore, there may be the case where a temperature difference of from about 4 to 6° C. is locally caused.

In the $TiO_2$—$SiO_2$ glass of the invention, the COT falls within the range of from 40 to 110° C., more preferably from 45 to 100° C., and especially preferably from 50 to 80° C.

In the $TiO_2$—$SiO_2$ glass of the invention, the average linear thermal expansion coefficient at from 20 to 100° C. is preferably 60 ppb/° C. or lower. According to this, in carrying out irradiation with high-energy EUV light, even when the temperature of the optical member rises from room temperature to a high temperature, the change in dimension or shape can be reduced. The average linear thermal expansion coefficient at from 20 to 100° C. is more preferably 50 ppb/° C. or lower, further preferably 40 ppb/° C. or lower, and especially preferably 30 ppb/° C. or lower. On the other hand, in the case where the COT is a high temperature, although the average linear thermal expansion coefficient at from 20 to 100° C. is liable to be a negative value, it is preferred for the same reasons that an absolute value of the average linear thermal expansion coefficient at from 20 to 100° C. is small. The average linear thermal expansion coefficient at from 20 to 100° C. is preferably −120 ppb/° C. or higher, more preferably −100 ppb/° C. or higher, and further preferably −60 ppb/° C. or higher. In the case where it is intended to make the change in dimension or shape smaller in carrying out irradiation with high-energy EUV light, the average linear thermal expansion coefficient at from 20 to 100° C. is preferably −50 ppb/° C. or higher, more preferably −40 ppb/° C. or higher, and especially preferably −30 ppb/° C. or higher.

It is known that the linear thermal expansion coefficient of the $TiO_2$—$SiO_2$ glass varies with the concentration of $TiO_2$ to be contained (see, for example, P. C. Schultz and H. T. Smyth, in: R. W. Douglas and B. Ellis, *Amorphous Materials*, Willey, New York, p. 453 (1972)).

Accordingly, it is possible to control the COT of the $TiO_2$—$SiO_2$ glass by controlling the $TiO_2$ content.

In the $TiO_2$—$SiO_2$ glass of the present invention, the $TiO_2$ content is preferably from 7.5 to 12% by mass. When the $TiO_2$ content is within the above range, the COT tends to fall within the range of from 40 to 110° C.

Specifically, when the $TiO_2$ content is less than 7.5% by mass, the COT tends to be lower than 40° C. Also, when the $TiO_2$ content exceeds 12% by mass, the COT tends to exceed 110° C., or negative expansion tends to occur in the range of from −150 to 200° C. Also, there is a possibility that a crystal of rutile, etc. is easily precipitated, or a bubble is easy to remain. The $TiO_2$ content is preferably 11% by mass or less, and more preferably 10% by mass or less. Also, the $TiO_2$ content is preferably 8% by mass or more, and more preferably 8.5% by mass or more.

Furthermore, the present inventors have found that the average linear thermal expansion coefficient at from 20 to 100° C. is reduced by increasing the $TiO_2$ content and decreasing the fictive temperature.

In the $TiO_2$—$SiO_2$ glass of the invention, when the $TiO_2$ content is from 7.5 to 12% by mass, and the fictive temperature is 1,100° C. or lower, the average linear thermal expansion coefficient at from 20 to 100° C. can be 60 ppb/° C. or lower. When the fictive temperature exceeds 1,100° C., the average linear thermal expansion coefficient at from 20 to 100° C. exceeds 60 ppb/° C.; and in the case where the $TiO_2$—$SiO_2$ glass is used as an optical member for an exposure tool for EUVL, there is a concern that the thermal expansion due to a change in temperature of the optical member is of a problem at the time of irradiation with EUV light. The fictive temperature is more preferably 1,000° C. or lower, and further preferably 950° C. or lower. In order to more reduce the average linear thermal expansion coefficient at from 20 to 100° C., the fictive temperature is preferably 900° C. or lower, more preferably 850° C. or lower, and especially preferably 800° C. or lower.

Also, it is preferred that the temperature width in which the coefficient of linear thermal expansion (CTE) becomes 0±5 ppb/° C. ($\Delta T$) of the $TiO_2$—$SiO_2$ glass of the invention is 5° C. or greater. In the case where the $\Delta T$ is 5° C. or greater, when the $TiO_2$—$SiO_2$ glass is used as an optical member of an exposure tool for EUVL, the thermal expansion of the optical member is suppressed at the time of irradiation with EUV light. The $\Delta T$ is more preferably 6° C. or greater, and further preferably 8° C. or greater. What the $\Delta T$ is 15° C. or greater is especially preferred because the CTE is able to attain 0±5 ppb/° C. in the temperature range of from 50 to 80° C.

In order to obtain the $TiO_2$—$SiO_2$ glass of the invention having a fictive temperature of 1,100° C. or lower, a method of keeping a $TiO_2$—$SiO_2$ glass molded article formed in a prescribed shape at a temperature of from 600 to 1,200° C. for 2 hours or more and then cooling to 500° C. or lower at an average cooling rate of 10° C./hr or lower is effective. In order to achieve a lower fictive temperature, the glass is cooled preferably at a rate of 5° C./hr or lower, and more preferably at a rate of 3° C./hr or lower. When the glass is cooled at a slower average cooling rate, a lower fictive temperature is attained. For example, when the glass is cooled at a rate of 1° C./hr or lower, the fictive temperature can be 900° C. or lower. In that case, however, when the cooling is carried out at a low cooling rate, for example, at a rate of 1° C./hr or lower, only in the temperature range of from 1,000 to 800° C. and at a cooling rate of 5° C./hr or higher in other temperature region, the time can be shortened.

Similarly, in order to make a variation of the fictive temperature fall within 50° C., a $TiO_2$—$SiO_2$ glass molded article may be kept at a temperature of from 600 to 1,200° C. for 2 hours or more and then subjected to temperature decrease to 500° C. or lower at an average cooling rate of 10° C./hr or lower.

The fictive temperature of the $TiO_2$—$SiO_2$ glass can be measured by known procedures. In the Examples as described below, the fictive temperature of the $TiO_2$—$SiO_2$ glass was measured by the following procedures.

With respect to a mirror-polished $TiO_2$—$SiO_2$ glass, an absorption spectrum is obtained by an infrared spectrometer (Magna 760, manufactured by Nikolet Company was used in the Examples as described below). In this measurement, a data-taking interval is set up at about 0.5 cm$^{-1}$, and an average value obtained by scanning 64 times is employed for the absorption spectrum. In the thus obtained infrared absorption spectrum, a peak observed in the vicinity of about 2,260 cm$^{-1}$ is attributed to an overtone of stretching vibration by an Si—O—Si bond of the $TiO_2$—$SiO_2$ glass. A calibration curve is prepared from a glass of the same composition having a known fictive temperature by using this peak position, thereby determining the fictive temperature. Alternatively, a reflection spectrum of the surface is measured in the same manner by using the same infrared spectrometer. In the thus obtained infrared reflection spectrum, a peak observed in the vicinity of about 1,120 cm$^{-1}$ is attributed to stretching vibration by an Si—O—Si bond of the $TiO_2$—$SiO_2$ glass. A calibration curve is prepared from a glass of the same composition having a known fictive temperature by using this peak position, thereby determining the fictive temperature. A shift of the peak position by a change in the glass composition can be extrapolated from the composition dependency of the calibration curve.

When the $TiO_2$—$SiO_2$ glass of the invention is used as an optical member for an exposure tool for EUVL, it is important to make the $TiO_2$/$SiO_2$ composition ratio in the glass uniform from the standpoint of reducing a variation of the linear thermal expansion coefficient in the glass.

In the $TiO_2$—$SiO_2$ glass of the invention, a variation of the fictive temperature is preferably within 50° C., and more preferably within 30° C. When the variation of the fictive temperature exceeds the foregoing range, there is a concern that a difference in the linear thermal expansion coefficient is generated depending upon the site.

In this specification, the "variation of the fictive temperature" is defined as a difference between the maximum value and the minimum value of the fictive temperature within an area of 30 mm×30 mm in at least one plane.

The variation of the fictive temperature can be measured as follows. A transparent $TiO_2$—$SiO_2$ glass body formed in a prescribed size is sliced to form a $TiO_2$—$SiO_2$ glass block of 50 mm×50 mm×6.35 mm. With respect to the 50 mm×50 mm area of this $TiO_2$—$SiO_2$ glass block, by measuring a fictive temperature at intervals of a 10 mm pitch according to the foregoing method, the variation of the fictive temperature of the formed $TiO_2$—$SiO_2$ glass body is determined.

In order to regulate the fictive temperature to 1,100° C. or lower, it is preferred that the $TiO_2$—$SiO_2$ glass of the invention has an OH concentration of 600 ppm or more. In the present specification, the unit of the OH concentration, "ppm" means ppm by mass.

By the addition of OH, the structural relaxation of the glass is accelerated so that it becomes easy to realize a glass structure having a low fictive temperature. Therefore, for the purpose of lowering the fictive temperature of the $TiO_2$—$SiO_2$ glass, it is an effective measure to incorporate OH. When the OH concentration is less than 600 ppm, it takes a very long period of time to obtain a $TiO_2$—$SiO_2$ glass having a fictive temperature of 1,100° C. or lower.

The OH concentration of the $TiO_2$—$SiO_2$ glass can be measured by using a known method. For example, the OH concentration can be determined from an absorption peak at a wavelength of 2.7 μm through the measurement by an infrared spectrometer (see J. P. Williams, et al., *American Ceramic Society Bulletin*, 55(5), 524, 1976). The detection limit by this method is 0.1 ppm.

As the method for manufacturing the $TiO_2$—$SiO_2$ glass of the invention, there are several processes as follows. As one example thereof, there is a manufacturing method in which a $TiO_2$—$SiO_2$ glass fine particle (soot) obtained by flame hydrolysis or thermal decomposition of a silica precursor and a titania precursor each serving as a glass-forming raw material is deposited and grown by a soot process, thereby obtaining a porous $TiO_2$—$SiO_2$ glass body; the obtained porous $TiO_2$—$SiO_2$ glass body is heated to a densification temperature or higher and further heated to a transparent vitrification temperature or higher, thereby obtaining a transparent $TiO_2$—$SiO_2$ glass body; and the obtained transparent $TiO_2$—$SiO_2$ glass body is treated in a high-pressure hydrogen atmosphere, thereby obtaining a hydrogen-containing $TiO_2$—$SiO_2$ glass body. Examples of the soot process include an MCVD process, an OVD process and a VAD process depending upon the preparation manner.

Also, there is a manufacturing method in which a silica precursor and a titania precursor each serving as a glass-forming raw material are hydrolyzed and oxidized in an oxyhydrogen flame at from 1,800 to 2,000° C., thereby obtaining a hydrogen-containing $TiO_2$—$SiO_2$ glass body. At that time, the hydrogen molecule concentration is controlled by controlling the flame temperature or gas concentration.

The densification temperature as referred to in this specification means a temperature at which the porous glass body can be densified to such an extent that a void cannot be confirmed by an optical microscope. Also, the transparent vitrification temperature as referred to herein means a temperature at which a crystal cannot be confirmed by an optical microscope, and a transparent glass is obtainable.

In the $TiO_2$—$SiO_2$ glass of the invention, so far as the variation of the fictive temperature falls within 50° C., and the variation of the OH concentration falls within 50 ppm, it enables the distribution of linear thermal expansion coefficient to fall within 30 ppb/° C. within an area of 30 mm×30 mm in at least one plane, and hence the $TiO_2$—$SiO_2$ glass is suitable as an optical member for an exposure tool for EUVL.

The distribution of linear thermal expansion coefficient of the $TiO_2$—$SiO_2$ glass can be measured by using a known method. For example, a transparent $TiO_2$—$SiO_2$ glass body formed in a prescribed size is cut and divided into $TiO_2$—$SiO_2$ glass small pieces of 15 mm×15 mm×1 mm, and the respective small pieces are measured for a linear thermal expansion coefficient according to the foregoing method, thereby determining the variation of the linear thermal expansion coefficient of a formed $TiO_2$—$SiO_2$ glass block.

For the purpose of manufacturing the $TiO_2$—$SiO_2$ glass of the invention, a manufacturing method including the following steps (a) to (f) can be adopted.

Step (a):

A $TiO_2$—$SiO_2$ glass fine particle obtained through flame hydrolysis of a silica precursor and a titania precursor each serving as a glass-forming raw material are deposited and grown on a substrate, thereby forming a porous $TiO_2$—$SiO_2$ glass body. The glass-forming raw material is not particularly limited so far as it is a raw material capable of being gasified. Examples of the silica precursor include silicon halides such as chlorides, for example, $SiCl_4$, $SiHCl_3$, $SiH_2Cl_2$, $SiH_3Cl$, etc., fluorides, for example, $SiF_4$, $SiHF_3$, $SiH_2F_2$, etc., bromides, for example, $SiBr_4$, $SiHBr_3$, etc., and iodides, for example, $SiI_4$, etc.; and alkoxysilanes represented by $R_nSi(OR)_4$, (wherein R represents an alkyl group having from 1 to 4 carbon atoms; n represents an integer of from 0 to 3; and the plural R may be the same or different). Also, examples of the titania precursor include titanium halides, for example, $TiCl_4$, $TiBr_4$, etc.; and alkoxy titaniums represented by $R_nTi(OR)_{4-n}$ (wherein R represents an alkyl group having from 1 to 4 carbon atoms; n represents an integer of from 0 to 3; and the plural R may be the same or different). Also, as the silica precursor and the titania precursor, a compound of Si and Ti such as a silicon titanium double alkoxide, etc. can be used.

A seed rod made by silica glass (for example, the seed rod described in JP-B-63-24973) can be used as the substrate. Also, the shape of the substrate to be used is not limited to a rod form but may be in a tabular form.

Step (b):

The porous $TiO_2$—$SiO_2$ glass body obtained in the step (a) is subjected to temperature rise to a densification temperature under a reduced pressure or in a helium atmosphere, thereby obtaining a $TiO_2$—$SiO_2$ dense body. The densification temperature is usually from 1,250 to 1,550° C., and especially preferably from 1,300 to 1,500° C.

Step (c):

The $TiO_2$—$SiO_2$ dense body obtained in the step (b) is subjected to temperature rise to the transparent vitrification temperature, thereby obtaining a transparent $TiO_2$—$SiO_2$ glass body. The transparent vitrification temperature is usually from 1,350 to 1,800° C., and especially preferably from 1,400 to 1,750° C.

As the atmosphere, an atmosphere of 100% of an inert gas such as helium or argon, or an atmosphere containing, as a major component, an inert gas such as helium and/or argon, is preferred. With respect to the pressure, a reduced pressure or normal pressure is applicable. In the case of a reduced pressure, the pressure is preferably 13,000 Pa or lower.

Step (d):

The transparent $TiO_2$—$SiO_2$ glass body obtained in the step (c) is heated at a temperature of the softening point or higher and formed in a desired shape, thereby obtaining a formed $TiO_2$—$SiO_2$ glass body. The forming temperature is preferably from 1,500 to 1,800° C. When the forming temperature is lower than 1,500° C., since the viscosity of the transparent $TiO_2$—$SiO_2$ glass is high, deformation due to own weight does not substantially proceed. Also, the growth of cristobalite which is a crystal phase of $SiO_2$, or the growth of rutile or anatase which is a crystal phase of $TiO_2$ may possibly occur, thereby causing so-called devitrification. When the forming temperature exceeds 1,800° C., there is a possibility that sublimation of $SiO_2$ cannot be neglected. The step (c) and the step (d) can be carried out continuously or simultaneously.

Step (e):

The formed $TiO_2$—$SiO_2$ glass body obtained in the step (d) is kept at a temperature of from 600 to 1,200° C. for one hour or more and then subjected to an annealing treatment for decreasing the temperature to 500° C. or lower at an average cooling rate of 10° C./hr or lower, thereby controlling the fictive temperature of the $TiO_2$—$SiO_2$ glass. Alternatively, the formed $TiO_2$—$SiO_2$ glass body obtained in the step (d) at 1,200° C. or higher is subjected to an annealing treatment for decreasing the temperature to 500° C. or lower at an average cooling rate of 60° C./hr or lower, thereby controlling the fictive temperature of the $TiO_2$—$SiO_2$ glass. After decreasing the temperature to 500° C. or lower, natural cooling can be adaptable. In that case, the atmosphere is preferably an atmosphere of 100% of an inert gas such as helium, argon or nitrogen, an atmosphere containing, as a major component, such an inert gas, or an air atmosphere; and the pressure is preferably a reduced pressure or normal pressure.

For the purpose of attaining a lower fictive temperature, it is effective to carry out cooling at a slower cooling rate in a temperature region in the vicinity of an annealing point or a strain point of the glass. Specifically, the slowest cooling rate in the cooling profile of the step (e) is preferably 10° C./hr or lower, more preferably 5° C./hr or lower, further preferably 3° C./hr or lower, and especially preferably 1° C./hr or lower.

Step (f):

The $TiO_2$—$SiO_2$ glass body obtained in the step (e) is kept in a hydrogen atmosphere in the temperature range of from 300 to 1,200° C. for 10 hours or more, thereby obtaining a hydrogen-containing $TiO_2$—$SiO_2$ glass body. As the atmosphere, an atmosphere of 100% of hydrogen, or a hydrogen atmosphere containing an inert gas such as helium or argon, is preferred; and a hydrogen partial pressure is preferably 0.1 atmospheres or more, more preferably 1 atmosphere or more, and further preferably 5 atmospheres or more. In order to improve the distribution of the hydrogen concentration, the holding time is preferably 10 hours or more, and more preferably 24 hours or more.

It is preferred that the $TiO_2$—$SiO_2$ glass of the invention is free from an inclusion. The inclusion as referred to herein means a foreign matter, a bubble, etc. existing in the glass. There is a concern that the foreign matter is generated by contamination or crystal precipitation in a glass manufacturing process. In order to eliminate the inclusion, such as a foreign matter or a bubble, it is necessary to control the contamination especially in the step (a), and further precisely control the temperature conditions of the steps (b) to (d).

In the case of preparing the $TiO_2$—$SiO_2$ glass of the invention in a direct method, in comparison with a usual synthesis condition, it is necessary to devise (1) increase of the hydrogen molecule concentration at the time of synthesis, (2) increase of the flame temperature, (3) increase of the deposited surface temperature, (4) decrease of the raw material gas concentration, and the like. As a combustion gas, gases including H in a molecular formula thereof are used; and an O/H ratio in all of the gases to be fed is preferably not more than 1.5, and more preferably not more than 1.3. The flame temperature is preferably 1,900° C. or higher, and more preferably 2,000° C. or higher. The deposited surface temperature is preferably 1,800° C. or higher, and more preferably 1,900° C. or higher. The raw material gas concentration in a gas pipe through which the raw material gas is delivered into a burner is preferably 20% by volume or less, and more preferably 10% by volume or less. It is preferred to carry out two or more items of the foregoing four items; it is more preferred to carry out three or more items of the foregoing four items; and it is especially preferred to carry out all of these items.

EXAMPLES

The invention will be illustrated in greater detail with reference to the following Examples, but the invention should not be construed as being limited thereto. Examples 1 to 3 are invention examples, and the remainder is comparative examples.

Example 1

$TiO_2$—$SiO_2$ glass fine particles obtainable by gasifying $TiCl_4$ and $SiCl_4$ each serving as a glass-forming raw material of a TiO$_2$—SiO$_2$ glass, respectively and then mixing them and subjecting the mixture to heat hydrolysis (flame hydrolysis) in an oxyhydrogen flame is deposited and grown on a rotating substrate, thereby forming a porous TiO$_2$—SiO$_2$ glass body (step (a)).

Since it is hard to handle the obtained porous TiO$_2$—SiO$_2$ glass body without any treatment, the obtained porous TiO$_2$—SiO$_2$ glass body is kept in air at 1,200° C. for 6 hours together with substrate and then separated from the substrate.

Thereafter, the porous TiO$_2$—SiO$_2$ glass body is placed in an atmosphere-controllable electric furnace, and the pressure is reduced to 10 Torr at room temperature. Thereafter, the temperature is increased to 1,450° C. in a helium gas atmosphere, and the system is kept at this temperature for 4 hours, thereby obtaining a TiO$_2$—SiO$_2$ dense body (step (b)).

The obtained TiO$_2$—SiO$_2$ dense body is heated to 1,700° C. in an argon atmosphere using a carbon furnace, thereby obtaining a transparent TiO$_2$—SiO$_2$ glass body (step (c)).

The obtained transparent TiO$_2$—SiO$_2$ glass body is heated to 1,750° C. and formed in a desired shape, thereby obtaining a formed TiO$_2$—SiO$_2$ glass body (step (d)).

The obtained glass is kept at 1,100° C. for 10 hours and then subjected to temperature decrease to 500° C. at a rate of 3° C./hr, followed by allowing it to stand for natural cooling (step (e)).

The obtained glass is kept in an atmosphere of 100% of hydrogen at 1 atmosphere at 500° C. for 73 hours, thereby obtaining a hydrogen-containing TiO$_2$—SiO$_2$ glass body (step (f)).

Example 2

A TiO$_2$—SiO$_2$ glass body is obtained in the same manner as in Example 1, except that in Example 1, the amount supplied of TiCl$_4$ is increased in the step (a); and that the hydrogen pressure is increased to 10 atmospheres in the step (f).

Example 3

A TiO$_2$—SiO$_2$ glass fine particle obtainable by gasifying TiCl$_4$ and SiCl$_4$ each serving as a glass-forming raw material of a TiO$_2$—SiO$_2$ glass, respectively and then mixing them and subjecting the mixture to heat hydrolysis (flame hydrolysis) in an oxyhydrogen flame is deposited and grown on a rotating substrate, thereby forming a porous TiO$_2$—SiO$_2$ glass body (step (a)).

Since it is hard to handle the obtained porous TiO$_2$—SiO$_2$ glass body without any treatment, the obtained porous TiO$_2$—SiO$_2$ glass body is kept in air at 1,200° C. for 6 hours together with the substrate and then separated from the substrate.

Thereafter, the porous TiO$_2$—SiO$_2$ glass body is placed in an atmosphere-controllable electric furnace, and the pressure is reduced to 10 Torr at room temperature. Thereafter, water is charged in a glass-made bubbler; an He gas is bubbled under atmospheric pressure at 100° C.; and the mixture is kept in this atmosphere at 1,000° C. under normal pressure for 4 hours while introducing a water vapor together with an He gas, thereby conducting OH doping.

Thereafter, the temperature is increased to 1,450° C. in the same atmosphere, and the mixture is then kept at this temperature for 4 hours, thereby obtaining an OH-containing TiO$_2$—SiO$_2$ dense body (step (b)).

The obtained OH-containing TiO$_2$—SiO$_2$ dense body is heated to 1,700° C. in an argon atmosphere using a carbon furnace, thereby obtaining an OH-containing transparent TiO$_2$—SiO$_2$ glass body (step (c)).

The obtained OH-containing transparent TiO$_2$—SiO$_2$ glass body is heated to a temperature of the softening point or higher (1,750° C.) and formed in a desired shape, thereby obtaining an OH-containing formed TiO$_2$—SiO$_2$ glass body (step (d)).

The obtained glass is kept at 1,100° C. for 10 hours and then successively subjected to temperature decrease to 900° C. at a rate of 10° C./hr, temperature decrease to 700° C. at a rate of 1° C./hr and temperature decrease to 500° C. at a rate of 10° C./hr, followed by allowing it to stand for normal cooling (step (e)).

The obtained glass is kept in an atmosphere of 100% of hydrogen at 10 atmospheres at 500° C. for 146 hours, thereby obtaining a hydrogen-containing TiO$_2$—SiO$_2$ glass body (step (f)).

Example 4

A TiO$_2$—SiO$_2$ glass body is obtained in the same manner as in Example 1, except that in Example 1, the feed amount of TiCl$_4$ is decreased in the step (a); that the cooling rate is regulated to 10° C./hr in place of the annealing in the step (e); and that the step (f) is not carried out.

Example 5

ULE#7972, manufactured by Corning Incorporated, which is known as a zero-expansion TiO$_2$—SiO$_2$ glass.

Results of the measurement of respective physical properties of the glasses prepared in the foregoing Examples 1 to 5 are summarized and shown in Table 1. With respect to the evaluation methods, the measurements were made in accordance with the above-described measurement methods, respectively. Also, the COT shown in Table 1 was derived by determining the temperature at which the linear thermal expansion coefficient was 0 ppb/° C. from the curve shown in FIG. 1. The ΔT shown in Table 1 was derived by determining the temperature range where the linear thermal expansion coefficient was from −5 to 5 ppb/° C. from the curve shown in FIG. 1.

TABLE 1

| | TiO$_2$ [%] | OH concentration [ppm] | Fictive temperature [° C.] | COT [° C.] | ΔT [° C.] | Average linear thermal expansion coefficient at from 20 to 100 ° C. [ppm/° C.] | Hydrogen molecule concentration [per cm$^3$] |
|---|---|---|---|---|---|---|---|
| Example 1 | 8.2 | 30 | 960 | 52 | 6.6 | 5.8 | $1.4 \times 10^{17}$ |
| Example 2 | 8.7 | 20 | 950 | 73 | 7.9 | −28 | $1.3 \times 10^{18}$ |
| Example 3 | 8.9 | 1030 | 790 | 52 | 8.8 | 0.7 | $1.6 \times 10^{18}$ |
| Example 4 | 6.7 | 30 | 1060 | 24 | 4.8 | 101 | N.D. |
| Example 5 | 7.2 | 880 | 900 | −2.4 | 4.1 | 61 | $1.1 \times 10^{17}$ |

As is clear from Table 1, in Examples 1 to 3 in which the COT falls within the range of from 40 to 110° C., the linear thermal expansion coefficient is substantially zero at the time of irradiation with high-EUV energy light, and the CTE is stably substantially zero over a wide temperature range, and therefore, the glasses of these Examples 1 to 3 are suitable as an optical member for an exposure tool for EUVL.

Also, since the glasses of the foregoing Examples 1 to 3 have a high hydrogen molecule concentration as $1\times10^{16}$ molecules/cm$^3$ or more, the physical properties of the multilayer can be kept over a long period of time by releasing hydrogen from the glass, and the glasses of these Examples 1 to 3 are suitable as an optical member for an exposure tool for EUVL.

While the invention has been described in detail and with reference to specific embodiments thereof, it will be apparent to one skill in the art that various changes and modifications can be made therein without departing from the sprit and scope thereof.

This application is based on Japanese patent application No. 2008-046267 filed on Feb. 27, 2008, the entire contents of which are incorporated hereinto by reference. All references cited herein are incorporated in their entirety.

INDUSTRIAL APPLICABILITY

The silica glass and the optical member of the invention are suitable for an exposure tool for EUV lithography.

The invention claimed is:

1. A TiO$_2$-containing silica glass having a TiO$_2$ content of at least 8% by mass, a fictive temperature of 1,100° C. or lower, a hydrogen molecule concentration of at least $1\times10^{17}$ molecules/cm$^3$, an OH concentration of at least 600 ppm, temperature width in which a linear thermal expansion coefficient is 0±5 ppb/° C. ($\Delta T$) of at least 8° C., and a temperature, at which a linear thermal expansion coefficient is 0 ppb/° C., falling within the range of from 40 to 110° C.

2. The TiO$_2$-containing silica glass according to claim 1, having a TiO$_2$ content of from 8 to 12% by mass.

3. The TiO$_2$-containing silica glass according to claim 1, having an average linear thermal expansion coefficient at from 20 to 100° C. of 60 ppb/° C. or lower.

4. The TiO$_2$-containing silica glass according to claim 1, wherein ($\Delta T$) is at least 15° C.

5. The TiO$_2$-containing silica glass according to claim 1, which is free from an inclusion.

6. An optical member for EUV lithography using the TiO$_2$-containing silica glass according to claim 1.

7. The TiO$_2$-containing silica glass according to claim 1, wherein the hydrogen molecule concentration is at least $5\times10^{17}$ molecules/cm$^3$.

8. The TiO$_2$-containing silica glass according to claim 1, wherein the hydrogen molecule concentration is at least $1\times10^{18}$ molecules/cm$^3$.

9. The TiO$_2$-containing silica glass according to claim 1, wherein the temperature, at which a linear thermal expansion coefficient is 0 ppb/° C., is within the range of from 45 to 100° C.

10. The TiO$_2$-containing silica glass according to claim 1, wherein the temperature, at which a linear thermal expansion coefficient is 0 ppb/° C., is within the range of from 50 to 80° C.

11. The TiO$_2$-containing silica glass according to claim 3, wherein the average linear thermal expansion coefficient at from 20 to 100° C. is at least −120 ppb/° C.

12. The TiO$_2$-containing silica glass according to claim 3, wherein the average linear thermal expansion coefficient at from 20 to 100° C. is at least −100 ppb/° C.

13. The TiO$_2$-containing silica glass according to claim 3, wherein the average linear thermal expansion coefficient at from 20 to 100° C. is at least −60 ppb/° C.

14. The TiO$_2$-containing silica glass according to claim 3, wherein the average linear thermal expansion coefficient at from 20 to 100° C. is at least −50 ppb/° C.

15. The TiO$_2$-containing silica glass according to claim 1, wherein the TiO$_2$ content is at least 8.5% by mass.

16. The TiO$_2$-containing silica glass according to claim 1, wherein the fictive temperature is 900° C. or lower.

17. The TiO$_2$-containing silica glass according to claim 1, wherein the fictive temperature is 850° C. or lower.

18. The TiO$_2$-containing silica glass according to claim 1, wherein the fictive temperature is 800° C. or lower.

19. The TiO$_2$-containing silica glass according to claim 1, wherein the variation in the fictive temperature is within 50° C.

20. The TiO$_2$-containing silica glass according to claim 1, wherein the variation in the fictive temperature is within 30° C.

* * * * *